United States Patent
Foxcroft et al.

(10) Patent No.: US 8,692,594 B2
(45) Date of Patent: Apr. 8, 2014

(54) PHASE-LOCKED LOOP FREQUENCY STEPPING

(75) Inventors: Michael R. Foxcroft, Toronto (CA); Shirley Pui Shan Lam, Richmond Hill (CA); George A. W. Guthrie, Mississauga (CA); Alexander Shternshain, Richmond Hill (CA); Jeffrey Herman, Sunnyvale, CA (US); Mihir S. Doctor, Sunnyvale, CA (US); Krishna Sitaraman, Sunnyvale, CA (US)

(73) Assignees: ATI Technologies ULC, Markham, Ontario (CA); Advanced Micro Devices, Inc., Sunnyvale, CA (US)

( * ) Notice: Subject to any disclaimer, the term of this patent is extended or adjusted under 35 U.S.C. 154(b) by 35 days.

(21) Appl. No.: 13/330,283

(22) Filed: Dec. 19, 2011

(65) Prior Publication Data

US 2013/0154694 A1 Jun. 20, 2013

(51) Int. Cl.
*H03L 7/18* (2006.01)

(52) U.S. Cl.
USPC ............................. 327/156; 327/147

(58) Field of Classification Search
CPC ................. H03L 7/0891; H03L 7/18
USPC .................................. 327/147, 156
See application file for complete search history.

(56) References Cited

U.S. PATENT DOCUMENTS

| | | | |
|---|---|---|---|
| 8,085,097 B2* | 12/2011 | Cloutier et al. | 331/4 |
| 8,421,542 B2* | 4/2013 | Romano et al. | 331/17 |
| 2007/0183014 A1* | 8/2007 | Coppola et al. | 359/238 |
| 2007/0252737 A1* | 11/2007 | Eikenbroek | 341/143 |
| 2009/0278611 A1* | 11/2009 | Cloutier et al. | 331/4 |
| 2012/0019327 A1* | 1/2012 | Romano et al. | 331/34 |
| 2012/0200284 A1* | 8/2012 | Dionne | 324/76.53 |
| 2012/0242383 A1* | 9/2012 | Elad et al. | 327/156 |
| 2013/0154694 A1* | 6/2013 | Foxcroft et al. | 327/156 |
| 2013/0176059 A1* | 7/2013 | Brauner | 327/105 |

OTHER PUBLICATIONS

Chang et al., "A Spread-Spectrum Clock Generator With Triangular Modulation." IEEE Journal of Solid-State Circuits, Apr. 2003, pp. 673-676, vol. 38, No. 4.

Howard, Andy, "Delta-Sigma Modulator PLLs With Dithered Divide-Ratio." Agilent EEsof EDA.

Galton, Ian, "Delta-Sigma Fractional-N Phase-Locked Loops." Phase-Locking in High-Performance Systems: From Devices to Architectures, Feb. 27, 2003, pp. 23-33, Wiley-IEEE Press.

* cited by examiner

*Primary Examiner* — Adam Houston

(74) *Attorney, Agent, or Firm* — Volpe and Koenig, P.C.

(57) ABSTRACT

A method and a phase-locked loop (PLL) for generating output clock signals with desired frequencies are described. The PLL is equipped with a ramp generator that increments or decrements a feedback divider value before providing it to a modulator. The modulator modulates the feedback divider value and provides the modulated value to a feedback divider of the PLL for performing frequency division.

20 Claims, 4 Drawing Sheets

PHASE-LOCKED LOOP FREQUENCY STEPPING

FIELD OF INVENTION

The present invention is generally directed to phase-locked loops.

BACKGROUND

Phase-locked loops (PLLs) are widely used in processor systems, communications systems, and signal processing systems, among others. PLLs are used for generating clock signals with various desired frequencies which are capable of being provided to a processor for running its internal logic. Processors derive their timing from these clock signals and the frequency of a processor's clock signal dictates the speed of execution of operational instructions by a processor.

Because the speed of execution of operational instructions may be adjusted by adjusting the frequency of the clock signal provided to the processor, there exists a proportional relationship between a processor's clock frequency and the processor's power consumption. A higher clock frequency results in a processor executing more instructions per unit of time and, therefore, the electrical circuitry and logic of this processor draw more current from its power source and dissipate more energy in the form of thermal energy.

PLLs are used to regulate speed of execution, power consumption, and heat dissipation of these processors. Therefore, managing power consumption in a processor system can be performed by managing the frequency of the output clock of the PLL in the processor system.

During the course of managing power consumption in a processor system, it is often required that power consumption be reduced considerably in a short amount of time, thereby necessitating an abrupt reduction of a PLL's output clock frequency to a new desired frequency that is much less than the current operating frequency. An example of this arises in a situation where a mobile phone's battery is low. The phone's user has just closed a computationally extensive application that required all the computational resources of the mobile phone's processor at the processor's maximum operating frequency, and then the user opens an application that requires few computational resources. In this example, as it is no longer necessary for the mobile phone's processor to operate at its maximum operating frequency, a power management unit of the mobile phone may want to considerably reduce the operating frequency of the processor in order to conserve battery power. Conversely, and in other situations, the operating frequency of the processor may need to be increased to accommodate for an increased workload.

In either event, the magnitude of the change in frequency and how quickly this change needs to take effect are two important considerations in PLLs. It is undesirable to suddenly change the output frequency to a new frequency that is very different from the current frequency, as this abrupt change will result in the processor immediately drawing more current at a much higher rate than before. This sudden change in current consumption results in a transient effect across the processor system's power supply network in what is known in the art as a di/dt effect or a load step. Furthermore, extreme changes in frequency are associated with a higher likelihood of resulting in a frequency overshoot or undershoot, in which case the processor will be operating at a different clock frequency than desired.

To counteract these problems, coarse-stepping to the new desired clock frequency may be performed. Although coarse-stepping alleviates some of the frequency overshoot or undershoot problems, coarse-stepping causes delay in reaching the new desired clock frequency. This delay is not only attributed to the inherent delay of achieving a desired frequency in many coarse steps (as opposed a single large step), but is also attributed to communication and handshake delays that occur when programming or commanding a PLL to coarse-step its frequency output, particularly when the communication is done across an asynchronous interface.

It is, therefore, desirable to have a method and apparatus to adjust the output frequency of a PLL without incurring significant delay, while at the same time minimizing the likelihood of a frequency overshoot and undershoot and load step.

SUMMARY OF EMBODIMENTS OF THE INVENTION

Embodiments of a method and a phase-locked loop (PLL) are provided. In the method and the PLL, the frequency of an input clock signal is divided by a first frequency division value to provide an output clock signal and the first frequency division value is modulated based on a second frequency division value. In one embodiment of the method and the PLL, the second frequency division value may be incremented or decremented by a ramp generator. Further, in the method and PLL, the modulation may be delta-sigma modulation. In another embodiment the incrementing or decrementing may be based on a slope and a desired feedback divider value.

Embodiments of a method and a phase-locked loop (PLL) are provided. In the method and PLL, a modulator modulated a first frequency division value to produce a second frequency division value and a frequency divider divides the frequency of an input clock signal by the second frequency division value to produce an output clock signal. In one embodiment, the first frequency division value is incremented or decremented. In another embodiment, the modulation is according to delta-sigma modulation. In a further embodiment, the incrementing or decrementing is based on a slope and a desired feedback divider value.

BRIEF DESCRIPTION OF THE DRAWINGS

A more detailed understanding may be had from the following description, given by way of example in conjunction with the accompanying drawings, wherein.

DETAILED DESCRIPTION OF THE EMBODIMENTS

Figure 1:
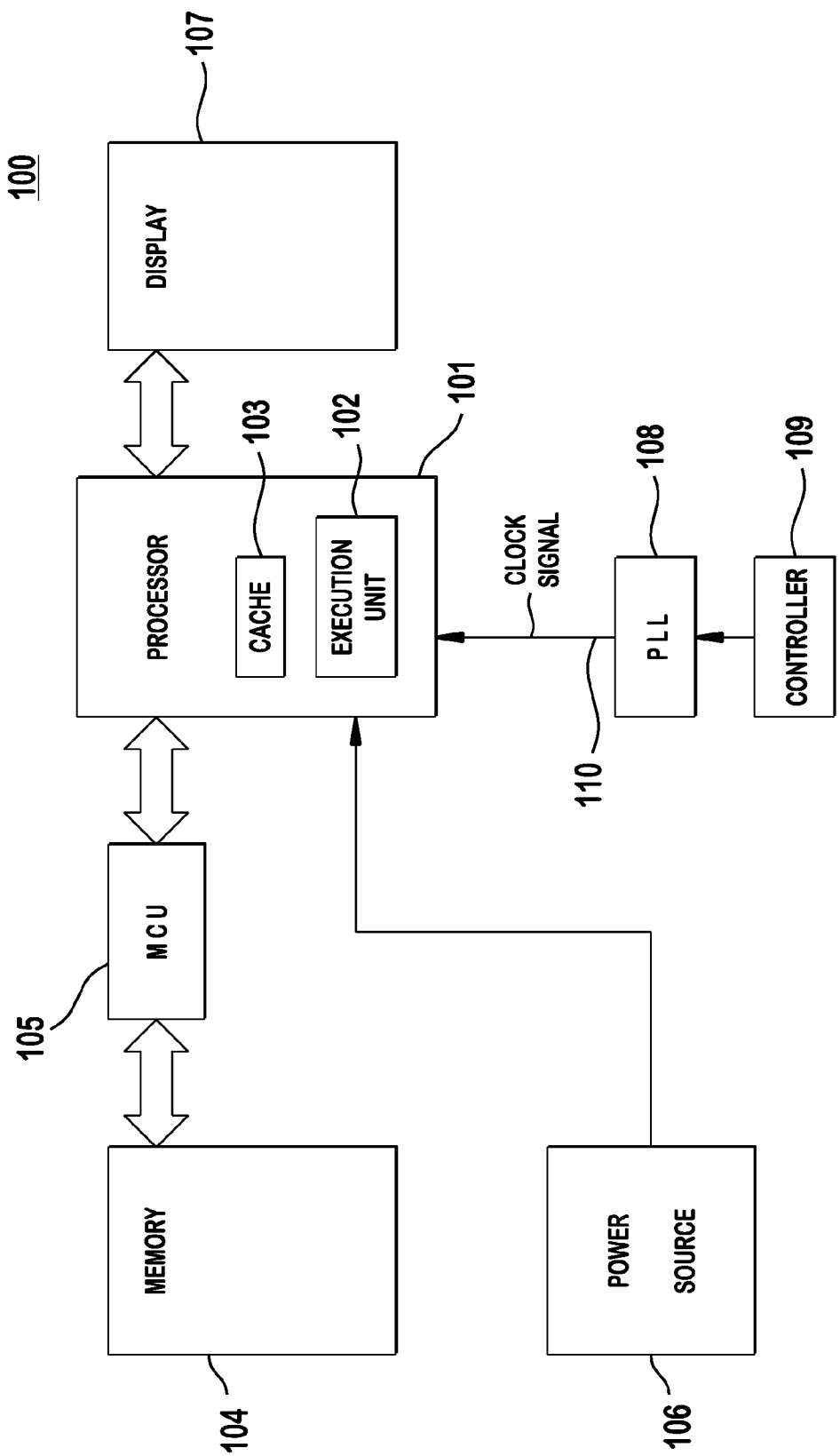
FIG. 1 is a block diagram of a processor system.

FIG. 1 shows a block diagram of a processor system 100. The processor system 100 includes a processor 101. The processor may be a controller, a digital signal processor (DSP), a central processing unit (CPU), a graphics processing unit (GPU), or an integrated processing unit having both graphics and general purpose computing capabilities in what is known in the art as an accelerated processing unit (APU). The processor may also be a GPU that is capable of performing general purpose computing tasks in what is known in the art as general purpose computation on GPU (GPGPU).

The execution unit 102 is the computational engine of the processor 101. The processor 101 is also equipped with a cache 103 for storing readily-accessible instructions and data. The cache 103 may be hierarchical and may have various levels, e.g., Level 1 (L1), Level 2 (L2), etc., that vary in both size and access time. Further, the cache 103 may be on- or off-chip or on- or off-die with the processor 101.

The processor 101 operates on data stored in cache 103 or in memory 104. The memory 104 may be system memory or disc storage and may be volatile or non-volatile. Examples of system memory include Random Access Memory (RAM), Dynamic RAM (DRAM), Synchronous DRAM (SDRAM), Static RAM (SRAM), Read-Only Memory (ROM), and electrically erasable programmable ROM (EEPROM), among others that are known in the art. Examples of disc storage include a hard drive (HD) and a solid-state drive (SSD), among others. Furthermore, memory 104 may be external to the computer system, where it may be cloud-based, i.e., stored off-site, where it is managed by a server and accessible to the processor 101 via a network connection. The memory 104 may also be in a network-attached storage (NAS) or a storage area network (SAN).

The processor 101 accesses the memory 104 using a memory controller unit (MCU) 105. The MCU 105 manages access to the memory 104 and requests data to be loaded from the memory 104 and sends data to be stored in the memory 104.

The computer system 100 is further equipped with a power source 106 which provides electric power to the circuitry of the computer system 100. The computer system 100 is also equipped with a display 107 for displaying user information.

The processor 101 of computer system 100 is provided with a clock signal 110 from which the processor 101 derives its timing, whereby the frequency of the clock signal 110 dictates the speed at which the processor 101 performs operational instructions.

Processors are designed to execute operational instructions in terms of clock cycles. By way of example, a processor that requires two clock cycles to perform an addition operation will need 2 nano seconds to perform the operation if it is running at a one giga Hertz (GHz) clock frequency, (i.e., one nano second (ns) clock cycle duration), whereas it will only need one nano second to perform the same operation if it is running at a two GHz clock frequency, (i.e., 0.5 ns clock cycle duration).

The processor 101 of computer system 100 is equipped with a phase-locked loop (PLL) 108, which supplies the clock signal 110 (with a desired frequency) to the processor 101. The PLL 108 is controlled by a controller 109. The controller 109 provides control information to the PLL 108 and causes the PLL to generate the desired frequency for the clock signal 110.

Figure 2:
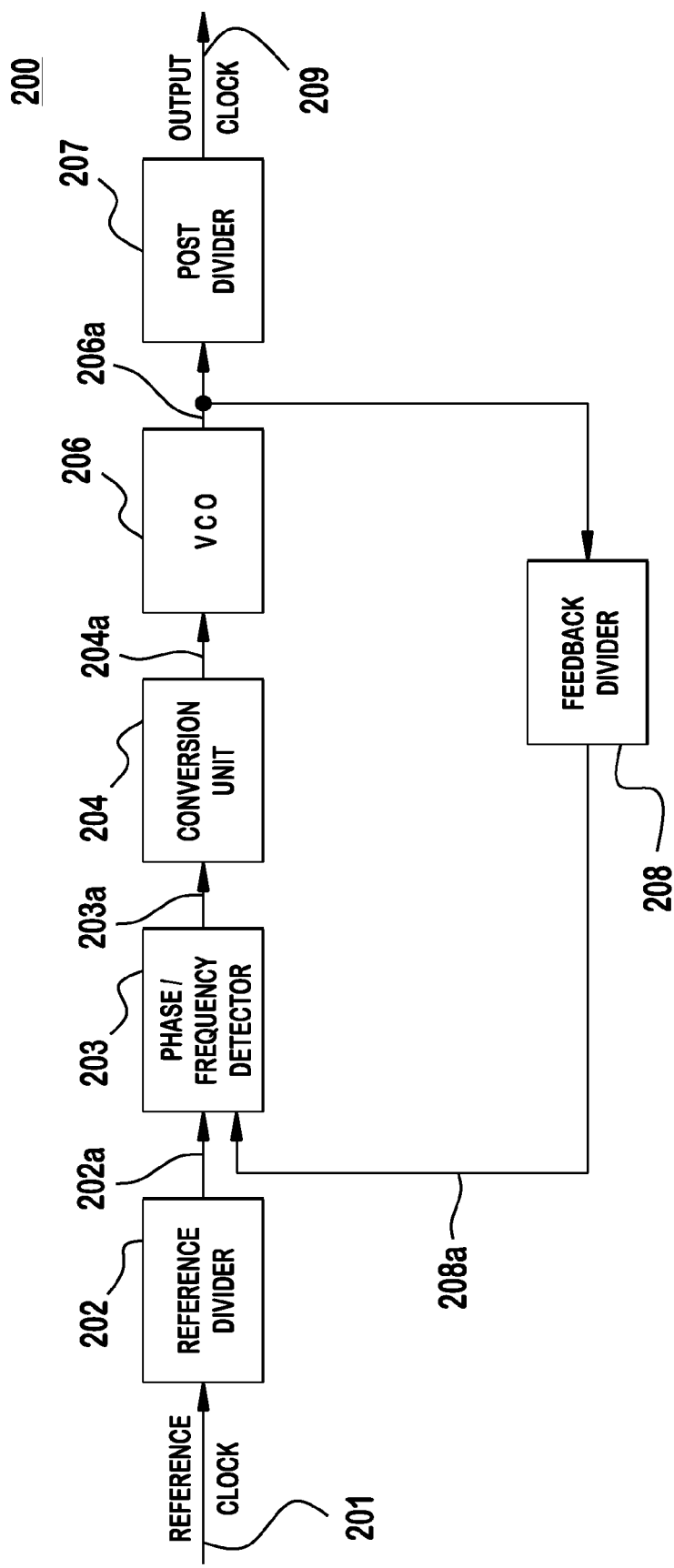
FIG. 2 is a block diagram of a phase-locked loop.

FIG. 2 shows a block diagram of a PLL 200 (e.g., PLL 108 of FIG. 1). The PLL 200 receives a reference clock signal 201 and provides an output clock signal 209. The reference clock signal 201 may be provided to the PLL 200 by a crystal oscillator or any other reliable clock source, (e.g., a system clock source). The PLL 200 uses the reference clock signal 201 to generate an output clock signal 209 with a desired frequency.

The reference clock signal 201 is fed to a reference divider 202 that divides the frequency of the reference clock signal 201. The reference divider 202 may be removed from PLL 200 or set to divide by one if initial division of the frequency of the reference clock signal 201 is not required. The reference divider 202 provides an output clock signal 202a to a phase/frequency detector (PFD) 203. Also provided to the PFD 203 is an output clock signal 208a of a feedback divider 208. The feedback divider 208 and the output clock signal 208a of the feedback divider 208 will be described shortly hereinafter. The PFD 203 compares the phase and frequency of output clock signals 202a, 208a and provides an output representing a difference between the phase and frequency of clock signals 202a, 208a. The PFD 203 ensures that the PLL compensates for any difference between the output clock signal 202a of the reference divider 202 and the output clock signal 208a of the feedback divider 208. When the output clock signal 202a of the reference divider and the output clock signal 208a of the feedback divider have the same frequency and do not have a phase difference, the output 203a of the PFD 203 will be zero. In this situation, when the PFD 203 does not detect a difference between clock signals 202a and 208a, the PLL 200 is considered to be locked.

The output 203a of the PFD 203 is provided to a conversion unit 204. The conversion unit 204 converts the output 203a of the PFD 203 into voltage that is used to drive voltage-controlled oscillator (VCO) 206. For example, the conversion unit 204 may be an analog circuit having a charge-pump and a loop filter. In this example, the charge pump converts the output 203a of the PFD 203 into electrical current and the loop filter converts the electrical current into voltage to be provided to the VCO 206. The VCO 206 generates a clock signal 206a at its output. The VCO 206 adjusts the frequency of the clock signal 206a at its output based on the voltage received from the conversion unit 204. When implemented as a charge-pump and loop filter, the conversion unit 204 may have inherent low-pass filtering characteristics. Further, the VCO 206 may also have low-pass filtering characteristics. The low-pass filtering characteristics make the PLL 200 low-pass in nature for signals 202a, 208a, and 203a and, therefore, able to filter out high components in the spectral domain of the signals. However, those skilled in the art recognize that VCO 206 may be replaced by another type of oscillator that is not voltage-controlled and the conversion unit 204 may be replaced accordingly to drive the oscillator.

Still referring to FIG. 2, the output clock signal 206a of the VCO 206 is then provided to a post divider 207. The post divider 207 divides the frequency of the output clock signal 206a of the VCO 206 to produce an output clock signal 209. The post divider 207 may divide the frequency by integer and non-integer values and may have a finite resolution beyond which the post divider 207 may not able to operate. An example of such resolution is a ⅛ resolution, whereby frequency division by fractions less than ⅛, (e.g., 1/32), is not possible. Similar to the reference divider 202, post divider 207 may be removed from PLL 200 or set to divide by one if post-division of the frequency of the output clock signal 206a of the VCO 206 is not required.

The output 206a of the VCO 206 is also provided to a feedback divider 208 in a feedback loop of the PLL 200. The feedback divider 208 divides the frequency of clock signal 206a to produce a feedback output clock signal 208a. As described above, the PFD 203 compares the feedback output clock signal 208a to clock signal 202a and the difference in frequency and phase between these two signals causes the VCO 206 to change its output frequency.

Therefore, PLL 200 of FIG. 2 may be configured to provide an output clock signal 209 of a certain frequency by adjusting the post divider 207 value to a suitable value. For example, when the PLL is locked (i.e., the PFD 203 does not detect a difference between input signals 202a and 208a) and the VCO 206 is providing a clock signal 206a with a frequency of 3 GHz, if an output clock 209 frequency of 1.5 GHz is required, this may be achieved by having the post divider 207 divide by 2 to produce an output clock 209 frequency of 1.5 GHz.

Alternatively, an output clock signal 209 with a desired frequency may be obtained from PLL 200 by properly changing the value of feedback divider 208. For example, when the frequency of the reference clock 201 is 25 mega Hz (MHz), the reference divider 202 frequency division value is one, and the VCO 206 output clock frequency is 1 GHz, it is expected that the feedback divider 208 value is 40 when the PLL 200 is locked. To obtain an output clock 209 frequency of 1.05 GHz, or a 5% increase, the value of the feedback divider must to be increased by 5% to 42. In this manner, an output clock 209 frequency of 1.05 GHz is achieved in PLL 200.

Alternatively, coarse-stepping may be utilized to obtain an output clock 209 frequency of 1.05 GHz by increasing the feedback divider 208 value to 41, (i.e., a 2.5% increase from 40), in a first step followed by another increase of the feedback divider 208 value from 41 to 42 in a second step.

Figure 3:
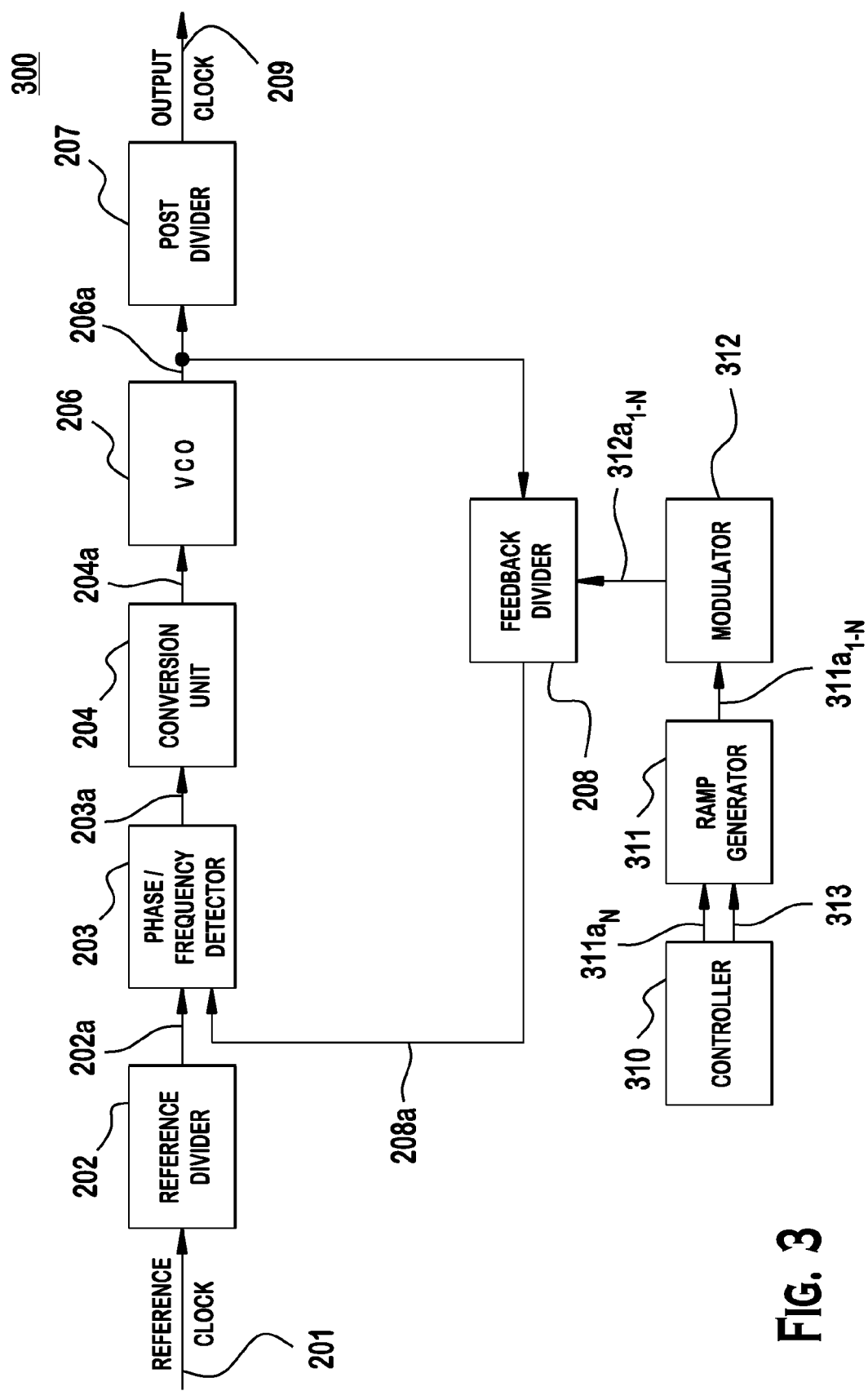
FIG. 3 is a block diagram of a phase-locked loop.

FIG. 3 shows a block diagram of a PLL 300. PLL 300 is equipped with a modulator 312 and a ramp generator 311. The modulator 312 may be a delta-sigma modulator (DSM), a pulse width modulator (PWM), a fractional N-term modulator, or any other type of modulator. Further, the modulator 312 may be of any order, i.e., first order, second order, among others.

A controller 310 programs the ramp generator 311 with a desired feedback divider value $311a_N$ and a slope 313 at which the ramp generator 311 may increment or decrement the current feedback divider value $311a_1$ to reach the desired feedback divider value $311a_N$.

The controller 310 issues a single command to the ramp generator 311 with the desired feedback divider value $311a_N$ and the slope 313, thus minimizing handshake delay between the controller 310 and the ramp generator 311 in the event that the controller 310 and the ramp generator 311 are asynchronously interfaced. The ramp generator 311 may know and be aware of the current feedback divider value $311a_1$, (e.g., from a previous operation). In the event that the ramp generator 311 is not aware of the current feedback divider value $311a_1$, the ramp generator 311 may be provided with the current feedback divider value $311a_1$.

Figure 4:
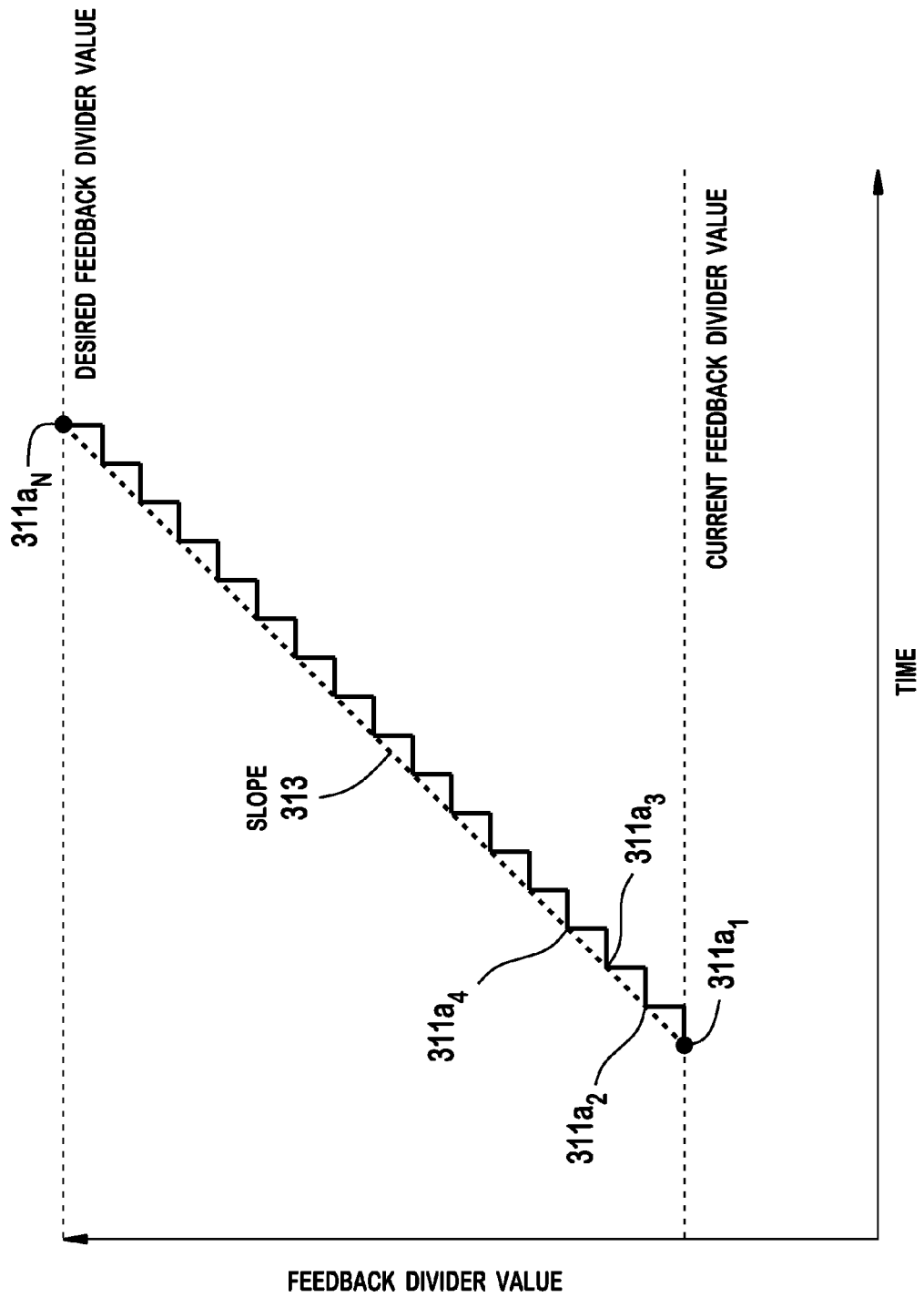
FIG. 4 is an example of using a slope to increment or decrement from a current feedback divider value to a desired feedback divider value.

FIG. 4 shows an example of the ramp generator 311 using the slope 313 to increment or decrement from the current feedback divider value $311a_1$ to the desired feedback divider value $311a_N$. The ramp generator 311 has knowledge of the current feedback divider value $311a_1$ and is provided the desired feedback divider value $311a_N$ and a slope 313. In FIG. 4, the ramp generator 311 increments the current feedback divider value $311a_1$ as dictated by the slope 313 to ultimately arrive at the desired feedback divider value $311a_N$.

The ramp generator 311 may alternatively increment or decrement in accordance with a parabolic or another non-linear curve, in which case the desired feedback divider value $311a_N$ and the slope 313 provided by the controller 310 are replaced by appropriate parameters that characterize the non-linear curve.

Referring back to FIG. 3, the ramp generator 311 increments or decrements the current feedback divider value $311a_1$ to arrive at the desired feedback divider value $311a_N$. The ramp generator 311 outputs feedback divider values $311a_1$, $311a_2$, ..., $311a_N$ (collectively hereinafter referred to as incremental or decremental feedback divider values $311a_{1-N}$, and singularly hereinafter referred to as incremental or decremental feedback divider value $311a_i$) at each increment or decrement to the modulator 312. The incremental or decremental feedback divider values $311a_{1-N}$ may be any integer, any fraction, or any combination of an integer or fraction. Further, the incremental or decremental feedback divider values $311a_{1-N}$ may be described using any number of bits. By way of example, an incremental or decremental feedback divider value $311a_i$ having a value of 40 and $17/4096$ may be described using 18 bits (6 bits for the integer and 12 bits for the fraction).

The modulator 312 modulates each of the incremental or decremental feedback divider values $311a_{1-N}$ provided by ramp generator 311 and provides modulated incremental or decremental feedback divider values $312a_{1-N}$ to the feedback divider 208. The feedback divider 208 then performs frequency division on clock signal 206a using modulated incremental or decremental feedback divider values $312a_{1-N}$ provided by the modulator 312. This process continues until the ramp generator 311 has incremented or decremented to the desired feedback divider value $311a_N$. Incrementing or decrementing the feedback divider value will cause PLL 300 to increase or decrease its output clock 209 frequency until it arrives at the desired clock frequency corresponding to the desired feedback divider value $311a_N$.

Still referring FIG. 3, the modulator 312 is aware of the resolution of the feedback divider 208. The resolution of the feedback divider 208 is the smallest fraction by which the feedback divider 208 may divide the frequency of clock signal 206a. By way of example, a feedback divider may have a ⅛ resolution, i.e., three-bit resolution, whereby the feedback divider is able to divide by a fraction of ⅛, i.e., ⅛, ¼, ½, but is not able to divide by 1/16, for example.

Accordingly, the modulator 312 receives an incremental or decremental feedback divider value $311a_i$ having any resolution from the ramp generator 311, and provides a modulated incremental or decremental feedback divider value $312a_i$ having a fixed resolution to feedback divider 208. The modulator 312 provides a modulated incremental or decremental feedback divider value $312a_i$ that meets the resolution of the feedback divider 208. When the incremental or decremental feedback divider value $311a_i$ meets the resolution of the feedback divider 208, then the modulator 312 provides a modulated incremental or decremental feedback divider value $312a_i$ having the same value as the incremental or decremental feedback divider value $311a_i$. Such is the case, for example, when the feedback divider 208 resolution is ⅛ and the incremental or decremental feedback divider value $311a_i$ is 20⅛. However, when the incremental or decremental feedback divider value $311a_i$ is outside of the resolution of the feedback divider 208, e.g., 20 3/16, then the modulator 312 may alternate the modulated incremental or decremental feedback divider value $312a_i$ between values that meet the resolution of the feedback divider 208.

Table 1 shows an example of two incremental or decremental feedback divider values $311a_i$ that are provided to the modulator 312 and their respective modulated incremental or decremental feedback divider values $312a_i$. For the example of Table 1, the resolution of the feedback divider is ⅛.

TABLE 1

Example of two incremental or decremental feedback divider values $311a_i$ and their respective modulated incremental or decremental feedback divider values $312a_i$.

| Incremental or decremental feedback divider values $311a_i$ | Modulated incremental or decremental feedback divider values $312a_i$ |
|---|---|
| 20 2/16 | 20 ⅛ |
|  | 20 ⅛ |
|  | 20 ⅛ |
|  | 20 ⅛ |

TABLE 1-continued

Example of two incremental or decremental feedback divider values $311a_i$ and their respective modulated incremental or decremental feedback divider values $312a_i$.

| Incremental or decremental feedback divider values $311a_i$ | Modulated incremental or decremental feedback divider values $312a_i$ |
|---|---|
| 20 3/16 | 20 1/8 |
|  | 20 2/8 |
|  | 20 1/8 |
|  | 20 2/8 |

In the example of Table 1, the first incremental or decremental feedback divider value $311a_i$ of 20 2/16 meets the 1/8 resolution of the feedback divider 208 and, therefore, the modulator 312 outputs a modulated incremental or decremental feedback divider values $312a_i$ having the same value. The second incremental or decremental feedback divider value $311a_i$ of 20 3/16 does not meet the resolution of the feedback divider 208 and, therefore, the modulator 312 outputs a modulated incremental or decremental feedback divider value $312a_i$ that alternates between 20 1/8 and 20 2/8 in order to achieve the appropriate value on average and over time.

Although in the above example the modulated incremental or decremental feedback divider value $312a_i$ alternates four times for every incremental or decremental feedback divider value $311a_i$, this example is non-limiting and any number of alternations is contemplated. Further, the modulating pattern shown in Table 1 is only exemplary and other modulation patterns are contemplated without departing from the scope of PLL 300.

The modulator 312, therefore, allows for higher resolution frequency division. Furthermore, the modulator 312 causes noise to be introduced in clock signal 208a. This noise may be concentrated in high-frequency bands of the spectral domain, as is the case when the modulator 312 is a delta-sigma modulator. As previously described, however, the conversion unit 204 may be low-pass in nature, whereby the conversion unit 204 filters out the high-frequency noise components introduced by the modulator 312. Therefore, the modulator 312 in PLL 300 is advantageous in that it provides high resolution feedback divider values, while having its high-frequency noise components filtered out. Furthermore, the modulator 312, coupled with the low-pass aspect of the conversion unit 204, makes the incremental or decremental change from the current feedback divider value $311a_1$ to the desired feedback divider value smoother $311a_N$.

PLL 300 may, therefore, cause the frequency of output clock signal 209 to change between any two frequencies. In a computer system, such as computer 100 of FIG. 1, the change of the frequency of the output clock signal 209 may be dictated by an algorithm that causes the computer system, to alternate between various power consumption states.

In an embodiment, VCO 206 of PLL 300 may be a multi-phase VCO capable of providing a number of clock signals that have the same frequency but are offset by a phase difference. For example, VCO 206 may be an 8-phase VCO capable of providing eight clock signals that have the same frequency but are offset by an eighth of a clock duration phase difference. Post divider 207 and feedback divider 208 may select any one of the clock signals provided by the multi-phase VCO for use for frequency division. Post divider 207 and feedback divider 208 may be configured to dynamically change the selected clock signal from VCO in order to achieve frequency division. Following this frequency division, the post divider 207 and feedback divider 208 may further divide the clock signal frequency by their respective post divider values or feedback divider values.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Although features and elements are described above in particular combinations, each feature or element may be used alone without the other features and elements or in various combinations with or without other features and elements. The methods provided may be implemented in a general purpose computer, a processor or any IC that utilizes power gating functionality. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

What is claimed is:

1. A phase-locked loop (PLL) comprising:
 a ramp generator for providing a modulator with a first frequency division value, wherein the ramp generator increments or decrements the first frequency division value from a current feedback divider value to a desired feedback divider value;
 a modulator for modulating the first frequency division value to produce a second frequency division value;
 a frequency divider having a resolution for dividing the frequency of an input clock signal by the second frequency division value at the resolution to produce an output clock signal; and
 the modulator configured to produce second frequency values having differing increments or decrements on a condition that an increment or a decrement generated for first frequency values is outside of the resolution of the frequency divider.

2. The PLL of claim 1 wherein the modulator is a delta-sigma modulator.

3. The PLL of claim 1, further comprising:
a controller for commanding the ramp generator.

4. The PLL of claim 1 wherein the ramp generator increments or decrements the first frequency division value based upon a slope.

5. The PLL of claim 1 wherein the ramp generator is aware of the current feedback divider value and the ramp generator is provided with a slope and a desired feedback divider value.

6. The PLL of claim 1 wherein the frequency divider has a resolution of $1/8$ for frequency division and the modulator is configured to produce second frequency values alternating between $20 1/8$ and $20 2/8$ for a respective generated first frequency value of $20 3/16$.

7. A method, implemented by a phase-locked loop (PLL), comprising:
incrementing or decrementing a first frequency division value from a current feedback divider value to a desired feedback divider value;
modulating the first frequency division value to produce a second frequency division value; and
dividing the frequency of an input clock signal by the second frequency division value at a resolution to produce an output clock signal, such that second frequency values are produced having differing increments or decrements on a condition that an increment or a decrement of the first frequency values is outside of the resolution of the frequency division.

8. The method of claim 7 wherein the modulator is a delta-sigma modulator.

9. The method of claim 7 wherein the incrementing or decrementing is based on a slope.

10. A computer system comprising:
a phase-locked loop (PLL) comprising:
a ramp generator for providing a modulator with a first frequency division value, wherein the ramp generator increments or decrements the first frequency division value from a current feedback divider value to a desired feedback divider value;
the modulator for modulating the first frequency division value to produce a second frequency division value;
a frequency divider having a resolution for dividing the frequency of an input clock signal by the second frequency division value at the resolution to produce an output clock signal; and
the modulator configured to produce second frequency values having differing increments or decrements on a condition that an increment or a decrement generated for first frequency values is outside of the resolution of the frequency divider.

11. The computer system of claim 10, further comprising:
a controller for commanding the ramp generator.

12. The computer system of claim 10 wherein the modulator is a delta-sigma modulator.

13. The computer system of claim 10 wherein the ramp generator increments or decrements the first frequency division value based upon a slope.

14. The computer system of claim 13 wherein the ramp generator is aware of the current feedback divider value and the ramp generator is provided with a slope and a desired feedback divider value.

15. The computer system of claim 10 wherein the frequency divider has a resolution of $1/8$ for frequency division and the modulator is configured to produce second frequency values alternating between $20 1/8$ and $20 2/8$ for a respective generated first frequency value of $20 3/16$.

16. The computer system of claim 10, further comprising:
a processor for performing operational instruction on data stored in memory, the processor deriving its timing from a second output clock signal of the PLL.

17. The computer system of claim 16, further comprising:
a memory for storing the data;
a power source for providing power to the processor; and
a display for displaying user information based on an outcome of the operational instructions performed by the processor.

18. A non-transitory computer-readable storage medium storing a set of instructions used for manufacturing a device including a phase-lock loop (PLL), the set of instructions comprising:
an incrementing or decrementing code segment for incrementing or decrementing a first frequency division value from a current feedback divider value to a desired feedback divider value;
a modulating code segment for modulating the first frequency division value to produce a second frequency division value;
a dividing code segment having a resolution for dividing the frequency of an input clock signal by the second frequency division value at the resolution to produce an output clock signal; and
the modulating code segment configured to produce second frequency values having differing increments or decrements on a condition that an increment or a decrement generated for first frequency values is outside of the resolution of the frequency divider.

19. The computer-readable storage medium of claim 18 wherein the modulator is a delta-sigma modulator.

20. The computer readable storage medium of claim 18, wherein the set of instructions are hardware description language (HDL) instructions used for the manufacture of a device.

* * * * *